United States Patent
Cojocaru et al.

(10) Patent No.: US 10,455,696 B2
(45) Date of Patent: Oct. 22, 2019

(54) ELECTRICALLY CONDUCTING ASSEMBLIES

(71) Applicant: SOLVAY SPECIALTY POLYMERS ITALY S.P.A., Bollate, MI (US)

(72) Inventors: Paula Cojocaru, Legnano (IT); Marco Apostolo, Senago (IT); Alessio Marrani, Lecco (IT); Ivan Falco, Sedriano (IT)

(73) Assignee: SOLVAY SPECIALTY POLYMERS ITALY S.P.A., Bollate (Milano) (IT)

( * ) Notice: Subject to any disclaimer, the term of this patent is extended or adjusted under 35 U.S.C. 154(b) by 156 days.

(21) Appl. No.: 14/917,172

(22) PCT Filed: Sep. 5, 2014

(86) PCT No.: PCT/EP2014/068977
§ 371 (c)(1),
(2) Date: Mar. 7, 2016

(87) PCT Pub. No.: WO2015/032915
PCT Pub. Date: Mar. 12, 2015

(65) Prior Publication Data
US 2016/0212844 A1    Jul. 21, 2016

(30) Foreign Application Priority Data
Sep. 6, 2013 (EP) .................... 13183282

(51) Int. Cl.
| | | |
|---|---|---|
| *H05K 3/12* | (2006.01) | |
| *H05K 1/02* | (2006.01) | |
| *C08J 7/06* | (2006.01) | |
| *H05K 3/00* | (2006.01) | |
| *H05K 3/18* | (2006.01) | |
| *H05K 3/22* | (2006.01) | |
| *H05K 3/46* | (2006.01) | |
| *C03C 17/38* | (2006.01) | |

(52) U.S. Cl.
CPC .......... *H05K 1/0298* (2013.01); *C03C 17/38* (2013.01); *C08J 7/06* (2013.01); *H05K 1/0274* (2013.01); *H05K 3/0041* (2013.01); *H05K 3/12* (2013.01); *H05K 3/125* (2013.01); *H05K 3/1225* (2013.01); *H05K 3/182* (2013.01); *H05K 3/227* (2013.01); *H05K 3/4661* (2013.01); *H05K 3/4664* (2013.01); *C08J 2367/02* (2013.01)

(58) Field of Classification Search
CPC ....... H05K 3/12; H05K 3/1208; H05K 3/1275
See application file for complete search history.

(56) References Cited

U.S. PATENT DOCUMENTS

| | | |
|---|---|---|
| 4,966,812 A | 10/1990 | Ashley et al. |
| 5,070,230 A | 12/1991 | Osada et al. |
| 5,411,792 A | 5/1995 | Yukinobu et al. |
| 2002/0110637 A1 | 8/2002 | Mase et al. |
| 2005/0287472 A1 | 12/2005 | Lee et al. |
| 2007/0259474 A1 | 11/2007 | Shin et al. |
| 2009/0020215 A1 | 1/2009 | Hood et al. |
| 2010/0096647 A1 | 4/2010 | Van Herpen et al. |
| 2010/0133484 A1 | 6/2010 | Heo et al. |
| 2010/0148131 A1 | 6/2010 | Kotake et al. |
| 2010/0270280 A1 | 10/2010 | Blanchard et al. |
| 2011/0185934 A1 | 8/2011 | Park et al. |
| 2012/0213935 A1 | 8/2012 | Fregonese et al. |

FOREIGN PATENT DOCUMENTS

| | | |
|---|---|---|
| EP | 2535180 A1 | 12/2012 |
| JP | 2002289090 A | 10/2002 |
| JP | 2002316471 A | 10/2002 |
| JP | 2002358916 A | 12/2002 |
| JP | 2002361997 A | 12/2002 |
| JP | 2002361998 A | 12/2002 |
| JP | 2003311916 A | 11/2003 |
| JP | 2010155882 A | 7/2010 |
| JP | 2010191125 A | 9/2010 |
| KR | 20080008022 A | 1/2008 |
| KR | 20090018538 A | 2/2009 |
| KR | 20110136144 A | 12/2011 |
| KR | 20120009612 A | 2/2012 |
| WO | 2007038950 A1 | 4/2007 |
| WO | 2012160468 A1 | 11/2012 |

*Primary Examiner* — Jeremy C Norris

(57) ABSTRACT

The present invention pertains to a process for the manufacture of a multilayer assembly comprising applying at least one patterned substrate onto at least one surface of at least one non-patterned substrate. The present invention also pertains to the multilayer assembly obtainable by said process and to uses of said multilayer assembly in various applications.

10 Claims, No Drawings

ELECTRICALLY CONDUCTING ASSEMBLIES

This application is a U.S national stage entry under 35 U.S.C. § 371 of International Application No. PCT/EP2014/068977 filed Sep. 5, 2014, which claims priority to European application No. 13183282.6 filed on Sep. 6, 2013. The entire contents of these applications are explicitly incorporated herein by this reference.

TECHNICAL FIELD

The present invention pertains to an optically transparent and electrically conducting multilayer assembly, to a process for its manufacture and to uses thereof in various applications.

BACKGROUND ART

Optically transparent and electrically conductive oxide (TCO) semiconductor materials have long been considered as promising functional materials in applications such as flat panel displays, thin film solar cells and laser and light emitting diodes, due to their distinctive combination of optical transparency in the visible spectrum and high electrical conductivity.

TCO semiconductor materials are typically binary or ternary compounds containing one or two metallic elements. Most representative examples of TCO semiconductor materials are impurity-doped ZnO, $In_2O_3$, $SnO_2$ and CdO as well as ternary compounds such as $Zn_2SnO_4$, $ZnSnO_3$, $Zn_2In_2O_5$, $Zn_3In_2O_6$, $In_2SnO_4$, $CdSnO_3$ and multi-component oxides consisting of combinations of ZnO, $In_2O_3$ and $SnO_2$.

At present, Sn-doped $In_2O_3$ (ITO) is the most-widely employed material for TCO applications. However, large-scale implementation of ITO is severely hampered due to the scarcity, toxicity and high cost of Indium.

Alternative TCO materials with comparable device performance to that of ITO are therefore highly desired.

Several methods have been developed for manufacturing TCO thin films on various substrates, typically on glass substrates, including chemical vapour deposition, physical vapour deposition, pulsed laser deposition and magnetron sputtering.

These methods typically require high annealing temperature post-treatment steps, usually above 400° C., in order to improve the film crystallinity of the as-deposited TCO materials. The improved film crystallinity advantageously results in better optical transmittance, electrical conductivity and carrier mobility.

However, because conventional substrates cannot withstand high annealing temperatures, the deposition process must be completed under relatively low temperatures.

It is thus still needed in the art to provide for an alternative process for easily manufacturing optically transparent and electrically conducting assemblies on a variety of substrates including polymeric substrates and for assemblies endowed with high transparency and high electrical conductivity properties homogeneously over their surfaces, especially over large area surfaces.

SUMMARY OF INVENTION

It has been now found that an optically transparent and electrically conducting multilayer assembly, which advantageously combine low absorption coefficients in the visible region of the electromagnetic spectrum and high electrical conductivity values, can be easily obtained by the process of the invention on a variety of substrates, especially polymeric substrates.

Also, it has been surprisingly found that, by combining an electrically conductive patterned film and an electrically conductive continuous film, it is possible to advantageously reduce the thickness of the multilayer assemblies thereby provided, thus ensuring low absorption coefficients in the visible region of the electromagnetic spectrum, while successfully obtaining higher electrical conductivity values and outstanding mechanical properties, homogeneously over their surfaces, especially over large area surfaces.

Further, it has been found that the process of the invention can be advantageously carried out in liquid phase, preferably in environmentally friendly water-based media.

In a first instance, the present invention pertains to a process for the manufacture of a multilayer assembly, said process comprising the following steps:

(1) providing at least one patterned substrate, said patterned substrate being obtainable by a process comprising:

(1-a) providing an optically transparent substrate layer [layer (LT-1)] having an outer surface and an inner surface, (1-b) providing a liquid composition [composition (L1)] comprising at least one first metal compound [compound (M1)], (1-c) optionally, providing a liquid composition [composition (L2)] comprising at least one second metal compound [compound (M2)], said compound (M2) being equal to or different from the compound (M1), (1-d) printing onto at least one surface of the layer (LT-1), using the composition (L1), a patterned layer [layer (LMP)], (1-e) optionally, contacting the layer (LMP) as provided in step (1-d) with the composition (L2), and (1-f) drying the patterned substrate provided in either step (1-d) or step (1-e) at a temperature of at least 50° C.;

(2) providing at least one non-patterned substrate, said non-patterned substrate being obtainable by a process comprising:

(2-a) providing an optically transparent substrate layer [layer (LT-2)] having an outer surface and an inner surface, said layer (LT-2) being equal to or different from the layer (LT-1), (2-b) providing a liquid composition [composition (L3)] comprising at least one optically transparent metal compound [compound ($M_{ot}$)], (2-c) optionally, treating at least one surface of the layer (LT-2) by a radio-frequency glow discharge process in the presence of an etching gas, (2-d) contacting the layer (LT-2) as provided in either step (2-a) or step (2-c) with the composition (L3) thereby providing an optically transparent non-patterned layer [layer (LMT)], and (2-e) drying the non-patterned substrate provided in step (2-d) at a temperature of at least 50° C.; and (3) applying said at least one patterned substrate onto at least one surface of said at least one non-patterned substrate thereby providing a multilayer assembly.

In a second instance, the present invention pertains to a multilayer assembly comprising:

(1) at least one patterned substrate, said patterned substrate comprising:

a patterned layer [layer (LMP)] made of a core of at least one first metal compound [compound (M1)] and, optionally, a shell of at least one second metal compound [compound (M2)] at least partially coating said core, said compound (M2) being equal to or different from said compound (M1), and optionally, directly adhered onto at least one surface of the layer (LMP), preferably onto one surface of the layer (LMP), an optically transparent substrate layer [layer (LT-1)]; and (2) at least one non-patterned substrate, said non-patterned substrate comprising:

an optically transparent substrate layer [layer (LT-2)] having an outer surface and an inner surface, said layer (LT-2) being equal to or different from the layer (LT-1), if any, and directly adhered onto at least one surface of the layer (LT-2), preferably onto one surface of the layer (LT-2), an optically transparent non-patterned layer [layer (LMT)] made of at least one optically transparent metal compound [compound ($M_{ot}$)], said at least one surface of the layer (LT-2) being optionally treated by a radio-frequency glow discharge process in the presence of an etching gas.

The multilayer assembly of the invention is advantageously obtainable by the process of the invention.

In a third instance, the present invention pertains to use of the multilayer assembly of the invention as optically transparent electrode in electronic devices.

The optically transparent electrode of the invention may be advantageously used in electronic devices such as panel displays, photovoltaic cells, windows, transistors, light emitting diodes and lasers.

For the purpose of the present invention, by "patterned substrate" it is meant a substrate comprising a patterned layer onto at least one surface of said substrate.

By the term "patterned layer" it is hereby intended to denote a layer having any pattern geometries.

For the purpose of the present invention, by "non-patterned substrate" it is meant a substrate comprising a continuous layer onto at least one surface of said substrate.

The layer (LMP) of the patterned substrate of the multilayer assembly of the invention is typically directly adhered onto the layer (LMT) of the non-patterned substrate.

The patterned substrate and the non-patterned substrate of the multilayer assembly of the invention are both advantageously optically transparent.

For the purpose of the present invention, by the term "optically transparent" it is meant optically transparent to incident electromagnetic radiation having a wavelength of from about 200 nm to about 3 µm.

The thickness of the layer (LT-1) or the layer (LT-2) is not particularly limited; it is nevertheless understood that layer (LT-1) and the layer (LT-2) will have typically a thickness of at least 5 µm, preferably of at least 10 µm. Layers (LT-1) and layers (LT-2) having a thickness of less than 5 µm, while still suitable for the multilayer assembly of the invention, will not be used when adequate mechanical resistance is required.

As per the upper limit of the thickness of the layer (LT-1) or the layer (LT-2), this is not particularly limited, provided that said layer (LT-1) and layer (LT-2) still can provide the optical transparency required for the particular field of use targeted.

The skilled in the art, depending on the nature of the layer (LT-1) and the layer (LT-2), will select the proper thickness of said layer (LT-1) and layer (LT-2) so as to provide for the optical transparency required.

The layer (LT-1) and the layer (LT-2), equal to or different from each other, advantageously have a transmittance of at least 75%, preferably of at least 80%, more preferably of at least 90% of the incident electromagnetic radiation.

The multilayer assembly of the invention is thus also advantageously optically transparent.

The multilayer assembly of the invention typically has a transmittance of at least 50%, preferably of at least 55%, more preferably of at least 60% of the incident electromagnetic radiation.

The transmittance is typically measured using a spectrophotometer according to any suitable techniques.

The layer (LMP) and the layer (LMT) are advantageously electrically conductive layers.

The multilayer assembly of the invention advantageously has an electrical resistivity of at most 50 Ω/square, preferably of at most 25 Ω/square, more preferably of at most 20 Ω/square, even more preferably of at most 15 Ω/square.

The multilayer assembly of the invention typically has a thickness comprised between 25 µm and 250 µm, preferably between 100 µm and 150 µm.

The layer (LT-1) and the layer (LT-2), equal to or different from each other, may be either porous substrate layers or non-porous substrate layers.

By the term "porous" it is hereby intended to denote a substrate layer containing pores of finite dimensions.

By the term "non-porous" it is hereby intended to denote a dense substrate layer free from pores of finite dimensions.

The layer (LT-1) and the layer (LT-2), equal to or different from each other, are typically made of materials selected from glass and polymers.

Non-limitative examples of suitable polymers include fluoropolymers, polyolefins such as polyethylene and polypropylene, polyethylene naphthalate, polyethylene terephthalate, polyamides, ethylene vinyl acetate and polyvinyl chloride.

The layer (LT-1) and the layer (LT-2), equal to or different from each other, are advantageously non-conductive substrate layers.

A non-conductive substrate layer distinguishes from an electrically conductive layer in that said non-conductive substrate layer has an electrical resistivity of more than 50 Ω/square.

The layer (LMP) is preferably a patterned grid layer [layer (LMP')] made of a core of at least one first metal compound [compound (M1)] and, optionally, a shell of at least one second metal compound [compound (M2)] at least partially coating said core, said compound (M2) being equal to or different from said compound (M1).

The patterned substrate of the multilayer assembly of the invention is preferably a patterned grid substrate comprising:

a patterned grid layer [layer (LMP')] made of a core of at least one first metal compound [compound (M1)] and, optionally, a shell of at least one second metal compound [compound (M2)] at least partially coating said core, said compound (M2) being equal to or different from said compound (M1), and optionally, directly adhered onto at least one surface of the layer (LMP'), preferably onto one surface of the layer (LMP'), an optically transparent substrate layer [layer (LT-1)].

By the term "patterned grid layer" it is hereby intended to denote a layer having a grid pattern geometry.

The layer (LMP') preferably has a mesh size comprised between 100 µm and 800 µm, preferably between 150 µm and 500 µm.

The layer (LMP') preferably has a bar width comprised between 5 µm and 70 µm, preferably between 7 µm and 35 µm.

The mesh size and the bar width of the layer (LMP') are typically measured using a digital microscope according to any suitable techniques.

The multilayer assembly of the invention, wherein the patterned substrate comprises a layer (LMP') having a mesh size comprised between 100 μm and 800 μm, preferably between 150 μm and 500 μm and a bar width comprised between 5 μm and 70 μm, preferably between 7 μm and 35 μm, is advantageously optically transparent and has a transmittance of at least 50%, preferably of at least 55%, more preferably of at least 60% of the incident electromagnetic radiation.

According to an embodiment of the process of the invention, the layer (LT-1) may be the non-patterned substrate of the multilayer assembly of the invention as defined above, said non-patterned substrate being obtainable by the process of the invention, said process comprising steps (2-a) to (2-e).

According to this embodiment of the process of the invention, the process for the manufacture of a multilayer assembly comprises providing at least one patterned substrate, said patterned substrate being obtainable by a process comprising:

(1'-a) providing an optically transparent substrate layer [layer (LT-1)] having an outer surface and an inner surface, (1'-b) providing a liquid composition [composition (L1)] comprising at least one first metal compound [compound (M1)], (1'-c) optionally, providing a liquid composition [composition (L2)] comprising at least one second metal compound [compound (M2)], said compound (M2) being equal to or different from the compound (M1), (1'-d) printing onto at least one surface of the layer (LT-1), using the composition (L1), a patterned layer [layer (LMP)], (1'-e) optionally, contacting the layer (LMP) as provided in step (1'-d) with the composition (L2), and (1'-f) drying the patterned substrate provided in either step (1'-d) or step (1'-e) at a temperature of at least 50° C., wherein said layer (LT-1) is a non-patterned substrate obtainable by a process comprising:

(2-a) providing an optically transparent substrate layer [layer (LT-2)] having an outer surface and an inner surface, (2-b) providing a liquid composition [composition (L3)] comprising at least one optically transparent metal compound [compound $(M_{ot})$], (2-c) optionally, treating at least one surface of the layer (LT-2) by a radio-frequency glow discharge process in the presence of an etching gas, (2-d) contacting the layer (LT-2) as provided in either step (2-a) or step (2-c) with the composition (L3) thereby providing an optically transparent non-patterned layer [layer (LMT)], and (2-e) drying the non-patterned substrate provided in step (2-d) at a temperature of at least 50° C.

The non-patterned substrate of this embodiment of the process of the invention typically comprises:

an optically transparent substrate layer [layer (LT-2)] having an outer surface and an inner surface, and directly adhered onto at least one surface of the layer (LT-2), preferably onto one surface of the layer (LT-2), an optically transparent non-patterned layer [layer (LMT)] made of at least one optically transparent metal compound [compound $(M_{ot})$], said at least one surface of the layer (LT-2) being optionally treated by a radio-frequency glow discharge process in the presence of an etching gas.

According to a variant of this embodiment of the process of the invention, under step (1'-d) the layer (LMP) of the patterned substrate is printed onto the opposite surface of the layer (LMT) of the non-patterned substrate.

According to a first embodiment of the invention, the multilayer assembly comprises:

(1) at least one patterned substrate, said patterned substrate comprising:
  a patterned layer [layer (LMP)] made of a core of at least one first metal compound [compound (M1)], and
  directly adhered onto at least one surface of the layer (LMP), preferably onto one surface of the layer (LMP), an optically transparent substrate layer [layer (LT-1)]; and (2) at least one non-patterned substrate, said non-patterned substrate comprising:
  an optically transparent substrate layer [layer (LT-2)] having an outer surface and an inner surface, said layer (LT-2) being equal to or different from the layer (LT-1), and
  directly adhered onto at least one surface of the layer (LT-2), preferably onto one surface of the layer (LT-2), an optically transparent non-patterned layer [layer (LMT)] made of at least one optically transparent metal compound [compound $(M_{ot})$], said at least one surface of the layer (LT-2) being optionally treated by a radio-frequency glow discharge process in the presence of an etching gas.

The patterned substrate of the multilayer assembly of this first embodiment of the invention is advantageously obtainable by the process of the invention, said process comprising steps (1-a), (1-b), (1-d) and (1-f).

The patterned substrate of the multilayer assembly of this first embodiment of the invention is typically supported onto a layer (LT-1).

The layer (LMP) of the patterned substrate of the multilayer assembly of this first embodiment of the invention is typically directly adhered onto the opposite surface of the layer (LMT) of the non-patterned substrate.

According to a variant of this first embodiment of the invention, the multilayer assembly comprises:

an optically transparent substrate layer [layer (LT-1)], directly adhered onto one surface of the layer (LT-1), a patterned layer [layer (LMP)] made of a core of at least one first metal compound [compound (M1)], directly adhered onto the opposite surface of the layer (LMP), an optically transparent non-patterned layer [layer (LMT)] made of at least one optically transparent metal compound [compound $(M_{ot})$], and directly adhered onto the opposite surface of the layer (LMT), an optically transparent substrate layer [layer (LT-2)], said layer (LT-2) being equal to or different from the layer (LT-1), wherein the surface of the layer (LT-2) directly adhered onto the opposite surface of the layer (LMT) is optionally treated by a radio-frequency glow discharge process in the presence of an etching gas.

According to a second embodiment of the invention, the multilayer assembly comprises:

(1) at least one patterned substrate, said patterned substrate comprising a patterned layer [layer (LMP)] made of a core of at least one first metal compound [compound (M1)] and, optionally, a shell of at least one second metal compound [compound (M2)] at least partially coating said core, said compound (M2) being equal to or different from said compound (M1); and (2) at least one non-patterned substrate, said non-patterned substrate comprising:

an optically transparent substrate layer [layer (LT-2)] having an outer surface and an inner surface, and directly adhered onto at least one surface of the layer (LT-2), preferably onto one surface of the layer (LT-2), an optically transparent non-patterned layer [layer (LMT)] made of at least one optically transparent metal compound [compound ($M_{ot}$)], said at least one surface of the layer (LT-2) being optionally treated by a radio-frequency glow discharge process in the presence of an etching gas.

The patterned substrate of the multilayer assembly of this second embodiment of the invention is typically free from a layer (LT-1).

Should the layer (LT-1) be a non-porous optically transparent substrate layer, the layer (LMP) typically detaches from said layer (LT-1) thereby providing the multilayer assembly of the second embodiment of the invention, said multilayer assembly comprising a self-standing patterned substrate free from a layer (LT-1).

The layer (LMP) of the patterned substrate of the multilayer assembly of this second embodiment of the invention is typically directly adhered onto the opposite surface of the layer (LMT) of the non-patterned substrate.

According to a first variant of this second embodiment of the invention, the multilayer assembly comprises:
  a patterned layer [layer (LMP)] made of a core of at least one first metal compound [compound (M1)] and a shell of at least one second metal compound [compound (M2)] at least partially coating said core, said compound (M2) being equal to or different from said compound (M1),
  directly adhered onto one surface of the layer (LMP), an optically transparent non-patterned layer [layer (LMT)] made of at least one optically transparent metal compound [compound ($M_{ot}$)], and
  directly adhered onto the opposite surface of the layer (LMT), an optically transparent substrate layer [layer (LT-2)],
wherein the surface of the layer (LT-2) directly adhered onto the opposite surface of the layer (LMT) is optionally treated by a radio-frequency glow discharge process in the presence of an etching gas.

The patterned substrate of the multilayer assembly of this first variant of the second embodiment of the invention is advantageously obtainable by the process of the invention, said process comprising steps (1-a) to (1-f).

The layer (LMP) of the patterned substrate of the multilayer assembly of this first variant of the second embodiment of the invention is typically directly adhered onto the opposite surface of the layer (LMT) of the non-patterned substrate.

According to a second variant of this second embodiment of the invention, the multilayer assembly comprises:
  a patterned layer [layer (LMP)] made of a core of at least one first metal compound [compound (M1)] and, optionally, a shell of at least one second metal compound [compound (M2)] at least partially coating said core, said compound (M2) being equal to or different from said compound (M1),
  directly adhered onto one surface of the layer (LMP), an optically transparent non-patterned layer [layer (LMT)] made of at least one optically transparent metal compound [compound ($M_{ot}$)], and
  directly adhered onto the opposite surface of the layer (LMT), an optically transparent substrate layer [layer (LT-2)],
wherein the surface of the layer (LT-2) directly adhered onto the opposite surface of the layer (LMT) is optionally treated by a radio-frequency glow discharge process in the presence of an etching gas.

The patterned substrate of the multilayer assembly of this second variant of the second embodiment of the invention is advantageously obtainable by the process of the invention, said process comprising steps (1'-a) to (1'-f).

The layer (LMP) of the patterned substrate of the multilayer assembly of this second variant of the second embodiment of the invention is typically directly adhered onto the opposite surface of the layer (LMT) of the non-patterned substrate.

For the purpose of the present invention, the term "fluoropolymer" is understood to mean a fluoropolymer comprising recurring units derived from at least one fluorinated monomer [polymer (F)].

By the term "fluorinated monomer" it is hereby intended to denote an ethylenically unsaturated monomer comprising at least one fluorine atom.

The term "at least one fluorinated monomer" is understood to mean that the polymer (F) may comprise recurring units derived from one or more than one fluorinated monomers. In the rest of the text, the expression "fluorinated monomers" is understood, for the purposes of the present invention, both in the plural and the singular, that is to say that they denote both one or more than one fluorinated monomers as defined above.

Non limitative examples of suitable fluorinated monomers include, notably, the followings:
  $C_3$-$C_8$ perfluoroolefins, such as tetrafluoroethylene (TFE) and hexafluoropropene (HFP);
  $C_2$-$C_8$ hydrogenated fluoroolefins, such as vinylidene fluoride (VDF), vinyl fluoride, 1,2-difluoroethylene and trifluoroethylene (TrFE);
  perfluoroalkylethylenes of formula $CH_2$=$CH$—$R_{f0}$ wherein $R_{f0}$ is a $C_1$-$C_6$ perfluoroalkyl group;
  chloro- and/or bromo- and/or iodo-$C_2$-$C_6$ fluoroolefins, such as chlorotrifluoroethylene (CTFE);
  (per)fluoroalkylvinylethers of formula $CF_2$=$CFOR_{f1}$ wherein $R_{f1}$ is a $C_1$-$C_6$ fluoro- or perfluoroalkyl group, $CF_3$, $C_2F_5$, $C_3F_7$;
  $CF_2$=$CFOX_0$ (per)fluoro-oxyalkylvinylethers, wherein $X_0$ is a $C_1$-$C_{12}$ alkyl group, a $C_1$-$C_{12}$ oxyalkyl group or a $C_1$-$C_{12}$ (per)fluorooxyalkyl group comprising one or more ether groups, such as perfluoro-2-propoxy-propyl group;
  (per)fluoroalkylvinylethers of formula $CF_2$=$CFOCF_2OR_{f2}$ wherein $R_{f2}$ is a $C_1$-$C_6$ fluoro- or perfluoroalkyl group, e.g. $CF_3$, $C_2F_5$, $C_3F_7$ or a $C_1$-$C_6$ (per)fluorooxyalkyl group comprising one or more ether groups, such as —$C_2F_5$—C—$CF_3$;
  functional (per)fluoro-oxyalkylvinylethers of formula $CF_2$=$CFOY_0$,
wherein $Y_0$ is a $C_1$-$C_{12}$ alkyl or (per)fluoroalkyl group, a $C_1$-$C_{12}$ oxyalkyl group or a $C_1$-$C_{12}$ (per)fluorooxyalkyl group comprising one or more ether groups and $Y_0$ comprising a carboxylic or sulfonic acid group, in its acid, acid halide or salt form;
  fluorodioxoles, preferably perfluorodioxoles; and
  cyclopolymerizable monomers of formula $CR_7R_8$=$CR_9OCR_{10}R_{11}(CR_{12}R_{13})_a(O)_b$ $CR_{14}$=$CR_{15}R_{16}$, wherein each $R_7$ to $R_{16}$, independently of one another, is selected from —F and a $C_1$-$C_3$ fluoroalkyl group, a is 0 or 1, b is 0 or 1 with the proviso that b is 0 when a is 1.

The polymer (F) may further comprise at least one hydrogenated monomer.

By the term "hydrogenated monomer", it is hereby intended to denote an ethylenically unsaturated monomer comprising at least one hydrogen atom and free from fluorine atoms.

The term "at least one hydrogenated monomer" is understood to mean that the polymer (F) may comprise recurring units derived from one or more than one hydrogenated monomers. In the rest of the text, the expression "hydrogenated monomers" is understood, for the purposes of the present invention, both in the plural and the singular, that is to say that they denote both one or more than one hydrogenated monomers as defined above.

Non limitative examples of suitable hydrogenated monomers include, notably, non-fluorinated monomers such as ethylene, propylene, vinyl monomers such as vinyl acetate, acrylic monomers such as methyl methacrylate and butyl acrylate, and styrene monomers such as styrene and p-methylstyrene.

The polymer (F) may be semi-crystalline or amorphous.

The term "semi-crystalline" is hereby intended to denote a polymer (F) having a heat of fusion of from 10 to 90 J/g, preferably of from 30 to 60 J/g, more preferably of from 35 to 55 J/g, as measured according to ASTM D3418-08.

The term "amorphous" is hereby intended to denote a polymer (F) having a heat of fusion of less than 5 J/g, preferably of less than 3 J/g, more preferably of less than 2 J/g as measured according to ASTM D-3418-08.

The polymer (F) is typically selected from the group consisting of:

(1) polymers (F-1) comprising recurring units derived from at least one fluorinated monomer selected from tetrafluoroethylene (TFE) and chlorotrifluoroethylene (CTFE), and from at least one hydrogenated monomer selected from ethylene, propylene and isobutylene, optionally containing one or more additional comonomers, typically in amounts of from 0.01% to 30% by moles, based on the total amount of TFE and/or CTFE and said hydrogenated monomer(s);

(2) polymers (F-2) comprising recurring units derived from vinylidene fluoride (VDF), and, optionally, from one or more fluorinated monomers different from VDF;

(3) polymers (F-3) comprising recurring units derived from tetrafluoroethylene (TFE) and at least one fluorinated monomer different from TFE selected from the group consisting of:
perfluoroalkylvinylethers of formula $CF_2=CFOR_{f1'}$ wherein $R_{f1'}$ is a $C_1$-$C_6$ perfluoroalkyl group;
perfluoro-oxyalkylvinylethers of formula $CF_2=CFOX_0$ wherein $X_0$ is a $C_1$-$C_{12}$ perfluorooxyalkyl group comprising one or more ether groups, such as perfluoro-2-propoxy-propyl group;
$C_3$-$C_8$ perfluoroolefins, such as hexafluoropropene (HFP); and
perfluorodioxoles of formula (I):

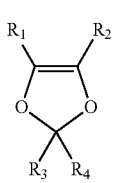

(I)

wherein $R_1$, $R_2$, $R_3$ and $R_4$, equal to or different from each other, are independently selected from the group consisting of —F, a $C_1$-$C_6$ fluoroalkyl group, optionally comprising one or more oxygen atoms, and a $C_1$-$C_6$ fluoroalkoxy group, optionally comprising one or more oxygen atoms; and (4) polymers (F-4) comprising recurring units derived from at least one cyclopolymerizable monomer of formula $CR_7R_8=CR_9OCR_{10}R_{11}(CR_{12}R_{13})_a(O)_bCR_{14}=CR_{15}R_{16}$, wherein each $R_7$ to $R_{16}$, independently of one another, is selected from —F and a $C_1$-$C_3$ fluoroalkyl group, a is 0 or 1, b is 0 or 1 with the proviso that b is 0 when a is 1.

The polymer (F-1) preferably comprises recurring units derived from ethylene (E) and at least one of chlorotrifluoroethylene (CTFE) and tetrafluoroethylene (TFE).

The polymer (F-1) more preferably comprises:

(a) from 30% to 48%, preferably from 35% to 45% by moles of ethylene (E);

(b) from 52% to 70%, preferably from 55% to 65% by moles of chlorotrifluoroethylene (CTFE), tetrafluoroethylene (TFE) or mixture thereof; and (c) up to 5%, preferably up to 2.5% by moles, based on the total amount of monomers (a) and (b), of one or more fluorinated and/or hydrogenated comonomer(s).

The comonomer is preferably a hydrogenated comonomer selected from the group of the (meth)acrylic monomers. The hydrogenated comonomer is more preferably selected from the group of the hydroxyalkylacrylate comonomers, such as hydroxyethylacrylate, hydroxypropylacrylate and (hydroxy) ethylhexylacrylate, and alkyl acrylate comonomers, such as n-butyl acrylate.

Among polymers (F-1), ECTFE copolymers, i.e. copolymers of ethylene and CTFE and, optionally, a third comonomer are preferred.

ECTFE polymers suitable in the process of the invention typically possess a melting temperature not exceeding 210° C., preferably not exceeding 200° C., even not exceeding 198° C., preferably not exceeding 195° C., more preferably not exceeding 193° C., even more preferably not exceeding 190° C. The ECTFE polymer has a melting temperature of advantageously at least 120° C., preferably of at least 130° C., still preferably of at least 140° C., more preferably of at least 145° C., even more preferably of at least 150° C.

The melting temperature is determined by Differential Scanning Calorimetry (DSC) at a heating rate of 10° C./min, according to ASTM D 3418.

ECTFE polymers which have been found to give particularly good results are those consisting essentially of recurring units derived from:

(a) from 35% to 47% by moles of ethylene (E);

(b) from 53% to 65% by moles of chlorotrifluoroethylene (CTFE).

End chains, defects or minor amounts of monomer impurities leading to recurring units different from those above mentioned can be still comprised in the preferred ECTFE, without this affecting properties of the material.

The melt flow rate of the ECTFE polymer, measured following the procedure of ASTM 3275-81 at 230° C. and 2.16 Kg, ranges generally from 0.01 to 75 g/10 min, preferably from 0.1 to 50 g/10 min, more preferably from 0.5 to 30 g/10 min.

The heat of fusion of polymer (F-1) is determined by Differential Scanning calorimetry (DSC) at a heating rate of 10° C./min, according to ASTM D 3418.

The polymer (F-1) typically has a heat of fusion of at most 35 J/g, preferably of at most 30 J/g, more preferably of at most 25 J/g.

The polymer (F-1) typically has a heat of fusion of at least 1 J/g, preferably of at least 2 J/g, more preferably of at least 5 J/g.

The polymer (F-1) is advantageously a semi-crystalline polymer.

The polymer (F-2) preferably comprises:
(a') at least 60% by moles, preferably at least 75% by moles, more preferably at least 85% by moles of vinylidene fluoride (VDF); and
(b') optionally, from 0.1% to 15% by moles, preferably from 0.1% to 12% by moles, more preferably from 0.1% to 10% by moles of one or more fluorinated monomers selected from vinylfluoride ($VF_1$), chlorotrifluoroethylene (CTFE), hexafluoropropene (HFP), tetrafluoroethylene (TFE), trifluoroethylene (TrFE) and perfluoromethylvinylether (PMVE).

The polymer (F-2) may further comprise from 0.01% to 20% by moles, preferably from 0.05% to 18% by moles, more preferably from 0.1% to 10% by moles of at least one (meth)acrylic monomer as defined above.

The polymer (F-3) preferably comprises recurring units derived from tetrafluoroethylene (TFE) and at least 1.5% by weight, preferably at least 5% by weight, more preferably at least 7% by weight of recurring units derived from at least one fluorinated monomer different from TFE.

The polymer (F-3) preferably comprises recurring units derived from tetrafluoroethylene (TFE) and at most 30% by weight, preferably at most 25% by weight, more preferably at most 20% by weight of recurring units derived from at least one fluorinated monomer different from TFE.

The polymer (F-3) is more preferably selected from the group consisting of:
polymers (F-3A) comprising recurring units derived from tetrafluoroethylene (TFE) and at least one perfluoroalkylvinylether selected from the group consisting of perfluoromethylvinylether of formula $CF_2$=$CFOCF_3$, perfluoroethylvinylether of formula $CF_2$=$CFOC_2F_5$ and perfluoropropylvinylether of formula $CF_2$=$CFOC_3F_7$; and
polymers (F-3B) comprising recurring units derived from tetrafluoroethylene (TFE) and at least one perfluorodioxole of formula (I):

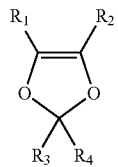

(I)

wherein $R_1$, $R_2$, $R_3$ and $R_4$, equal to or different from each other, are independently selected from the group consisting of —F, a $C_1$-$C_3$ perfluoroalkyl group, e.g. —$CF_3$, —$C_2F_5$, —$C_3F_7$, and a $C_1$-$C_3$ perfluoroalkoxy group optionally comprising one oxygen atom, e.g. —$OCF_3$, —$OC_2F_5$, —$OC_3F_7$, —$OCF_2CF_2OCF_3$; preferably, wherein $R_1$=$R_2$=—F and $R_3$=$R_4$ is a $C_1$-$C_3$ perfluoroalkyl group, preferably $R_3$=$R_4$=—$CF_3$ or wherein $R_1$=$R_3$=$R_4$=—F and $R_2$ is a $C_1$-$C_3$ perfluoroalkoxy, e.g. —$OCF_3$, —$OC_2F_5$, —$OC_3F_7$.

Non-limitative examples of suitable polymers (F-3A) include, notably, those commercially available under the trademark name HYFLON® PFA P and M series and HYFLON® MFA from Solvay Specialty Polymers Italy S.p.A.

The polymer (F-3B) more preferably comprises recurring units derived from tetrafluoroethylene (TFE) and at least one perfluorodioxole of formula (I) as defined above wherein $R_1$=$R_3$=$R_4$=—F and $R_2$=—$OCF_3$ or wherein $R_1$=$R_2$=—F and $R_3$=$R_4$=—$CF_3$.

Non-limitative examples of suitable polymers (F-3B) include, notably, those commercially available under the trademark name HYFLON® AD from Solvay Specialty Polymers Italy S.p.A. and TEFLON® AF from E. I. Du Pont de Nemours and Co.

The polymer (F-4) preferably comprises recurring units derived from at least one cyclopolymerizable monomer of formula $CR_7R_8$=$CR_9OCR_{10}R_{11}$ $(CR_{12}R_{13})_a(O)_b$ $CR_{14}$=$CR_{15}R_{16}$, wherein each $R_7$ to $R_{16}$, independently of one another, is —F, a=1 and b=0.

The polymer (F-4) is typically amorphous.

Non-limitative examples of suitable polymers (F-4) include, notably, those commercially available under the trademark name CYTOP® from Asahi Glass Company.

The polymer (F) is typically manufactured by suspension or emulsion polymerization processes.

The layer (LT-1) and the layer (LT-2), equal to or different from each other, are preferably made of materials selected from the group consisting of fluoropolymers, preferably polymers (F-1) as defined above, polyethylene naphthalate and polyethylene terephthalate.

For the purpose of the present invention, by "liquid composition" it is meant a medium in the liquid state at 20° C. under atmospheric pressure.

The composition (L1) typically comprises at least one compound (M1), water and at least one organic solvent [solvent (S)].

The compound (M1) may be a metal in its elemental state or a metal compound comprising one or more metal ions in an oxidative state.

The compound (M1) is typically selected from the group consisting of Rh, Ir, Ru, Ti, Re, Os, Cd, Tl, Pb, Bi, In, Sb, Al, Ti, Cu, Ni, Pd, V, Fe, Cr, Mn, Co, Zn, Mo, W, Ag, Au, Pt, Ir, Ru, Pd, Sn, Ge, Ga, alloys thereof and derivatives thereof.

Non-limitative examples of suitable solvents (S) include the followings:
aliphatic, cycloaliphatic or aromatic ether oxides, more particularly, diethyl oxide, dipropyl oxide, diisopropyl oxide, dibutyl oxide, methyltertiobutylether, dipentyl oxide, diisopentyl oxide, ethylene glycol dimethyl ether, ethylene glycol diethyl ether, ethylene glycol dibutyl ether benzyl oxide; dioxane, tetrahydrofuran (THF),
glycol ethers such as ethylene glycol monomethyl ether, ethylene glycol monoethyl ether, ethylene glycol monopropyl ether, ethylene glycol monoisopropyl ether, ethylene glycol monobutyl ether, ethylene glycol monophenyl ether, ethylene glycol monobenzyl ether, diethylene glycol monomethyl ether, diethylene glycol monoethyl ether, diethylene glycol mono-n-butyl ether,
glycol ether esters such as ethylene glycol methyl ether acetate, ethylene glycol monoethyl ether acetate, ethylene glycol monobutyl ether acetate,
alcohols such as methyl alcohol, ethyl alcohol, diacetone alcohol,
ketones such as acetone, methylethylketone, methylisobutyl ketone, diisobutylketone, cyclohexanone, isophorone, and
linear or cyclic esters such as: isopropyl acetate, n-butyl acetate, methyl acetoacetate, dimethyl phthalate, g-butyrolactone.

The composition (L1) preferably comprises at least one compound (M1) selected from the group consisting of Cu, Ni, Fe, Zn, Ag, Au, Pt, alloys thereof and derivatives thereof.

The composition (L1) is preferably free from any solvent (S).

Under step (1-d) of the process of the invention, the composition (L1) is typically printed onto at least one surface of the layer (LT-1) by screen, gravure, flexo or ink-jet printing techniques.

Under step (1-d) of the process of the invention, the composition (L1) is preferably printed onto at least one surface of the layer (LT-1) by ink-jet printing techniques.

Under step (1'-d) of the process of the invention, the composition (L1) is typically printed onto the opposite surface of the layer (LMT) by screen, gravure, flexo or ink-jet printing techniques.

Under step (1'-d) of the process of the invention, the composition (L1) is preferably printed onto the opposite surface of the layer (LMT) by ink-jet printing techniques.

The composition (L2) typically comprises at least one compound (M2) and at least one ionic liquid [liquid (I)].

The compound (M2) may be a metal in its elemental state or a metal compound comprising one or more metal ions in an oxidative state.

The compound (M2) may be equal to or different from the compound (M1).

The compound (M2) is typically selected from the group consisting of Rh, Ir, Ru, Ti, Re, Os, Cd, Tl, Pb, Bi, In, Sb, Al, Ti, Cu, Ni, Pd, V, Fe, Cr, Mn, Co, Zn, Mo, W, Ag, Au, Pt, Ir, Ru, Pd, Sn, Ge, Ga, alloys thereof and derivatives thereof.

For the purpose of the present invention, by the term "ionic liquid [liquid (I)]" it is meant a compound formed by the combination of positively charged cations and negatively charged anions in the liquid state at temperatures below 100° C. under atmospheric pressure.

The liquid (I) is typically selected from the group consisting of ionic liquids comprising:
- a cation selected from the group consisting of a sulfonium ion or an imidazolium, pyridinium, pyrrolidinium or piperidinium ring, said ring being optionally substituted on the nitrogen atom, in particular by one or more alkyl groups with 1 to 8 carbon atoms, and on the carbon atoms, in particular by one or more alkyl groups with 1 to 30 carbon atoms, and
- an anion selected from the groups consisting of halides anions, perfluorinated anions and borates.

The composition (L2) preferably comprises at least one compound (M2) selected from the group consisting of Cu, Ni, Fe, Zn, Ag, Au, Pt, Cr, Co, Pd, alloys thereof and derivatives thereof.

Under step (1-e) of the process of the invention, if any, the layer (LMP) as provided in step (1-d) is typically contacted with the composition (L2) by electroplating or electroless plating techniques.

Under step (1'-e) of the process of the invention, if any, the layer (LMP) as provided in step (1'-d) is typically contacted with the composition (L2) by electroplating or electroless plating techniques.

Should the process of the invention further comprise step (1-e) or step (1'-e), the layer (LMP) of the patterned substrate of the multilayer assembly thereby provided is typically made of a core of at least one first metal compound [compound (M1)] and a shell of at least one second metal compound [compound (M2)] at least partially coating said core, said compound (M2) being equal to or different from said compound (M1).

Should the process of the invention further comprise step (1-e) or step (1'-e), the patterned substrate of the multilayer assembly thereby provided is typically free from a layer (LT-1).

Should the process of the invention further comprise step (1-e) or step (1'-e), the layer (LMP) typically detaches from the layer (LT-1) thereby providing the multilayer assembly of the first variant of the second embodiment of the invention, said multilayer assembly comprising a self-standing patterned substrate free from a layer (LT-1).

For the purpose of the present invention, by "electroplating" it is meant a process, typically carried out in an electrolytic cell, wherein an electric current is used to reduce a metal compound from its oxidation state to its elemental state.

For the purpose of the present invention, by "electroless plating" it is meant a redox process, typically carried out in a plating bath, wherein a metal compound is reduced from its oxidation state to its elemental state in the presence of suitable chemical reducing agents.

Under step (1-e) of the process of the invention, if any, the layer (LMP) as provided in step (1-d) is preferably contacted with the composition (L2) by electroplating techniques.

Under step (1'-e) of the process of the invention, if any, the layer (LMP) as provided in step (1'-d) is preferably contacted with the composition (L2) by electroplating techniques.

Under step (1-f) of the process of the invention, the patterned substrate of the multilayer assembly provided in either step (1-d) or step (1-e) is typically dried at a temperature comprised between 50° C. and 150° C., preferably at a temperature comprised between 100° C. and 150° C.

Under step (1'-f) of the process of the invention, the patterned substrate of the multilayer assembly provided in either step (1'-d) or step (1'-e) is typically dried at a temperature comprised between 50° C. and 150° C., preferably at a temperature comprised between 100° C. and 150° C.

Under step (2-c) of the process of the invention, if any, at least one surface of the layer (LT-2) is treated by a radio-frequency glow discharge process in the presence of an etching gas.

By "radio-frequency glow discharge process" it is hereby intended to denote a process powered by a radio-frequency amplifier wherein a glow discharge is generated by applying a voltage between two electrodes in a cell containing an etching gas. The glow discharge so generated then passes through a jet head to arrive to the surface of the material to be treated.

By "etching gas" it is hereby intended to denote either a gas or a mixture of gases suitable for use in a radio-frequency glow discharge process.

The etching gas is preferably selected from air, $N_2$, $NH_3$, $CH_4$, $CO_2$, He, $O_2$, $H_2$ and mixtures thereof.

The radio-frequency glow discharge process is typically carried out under reduced pressure or under atmospheric pressure.

The radio-frequency glow discharge process is preferably carried out under atmospheric pressure at about 760 Torr.

Atmospheric-pressure plasmas have prominent technical significance because, in contrast with low-pressure plasma or high-pressure plasma, no reaction vessel is needed to ensure the maintenance of a pressure level differing from atmospheric pressure.

The radio-frequency glow discharge process is typically carried out at a radio-frequency comprised between 1 kHz and 100 kHz.

The radio-frequency glow discharge process is typically carried out at a voltage comprised between 1 kV and 50 kV.

According to a first embodiment of the process of the invention, the radio-frequency glow discharge process under step (2-c) generates a corona discharge.

The radio-frequency glow discharge process of this first embodiment of the process of the invention is typically carried out at a radio-frequency comprised between 5 kHz and 15 kHz.

The radio-frequency glow discharge process of this first embodiment of the process of the invention is typically carried out at a voltage comprised between 1 kV and 20 kV.

The corona discharge typically has a density comprised between $1 \times 10^9$ and $1 \times 10^{13}$ cm$^{-3}$.

According to a second embodiment of the process of the invention, the radio-frequency glow discharge process under step (2-c) generates a plasma discharge.

The radio-frequency glow discharge process of this second embodiment of the process of the invention is typically carried out at a radio-frequency comprised between 10 kHz and 100 kHz.

The radio-frequency glow discharge process of this second embodiment of the process of the invention is typically carried out at a voltage comprised between 5 kV and 15 kV.

The plasma discharge typically has a density comprised between $1 \times 10^{16}$ and $1 \times 10^{19}$ cm$^{-3}$.

The Applicant has found that, after treatment of the layer (LT-2) by a radio-frequency glow discharge process in the presence of an etching gas, the layer (LT-2) successfully maintains its bulk properties including its optical transparency.

The Applicant thinks, without this limiting the scope of the invention, that by a radio-frequency glow discharge process in the presence of ammonia atmosphere amine functionalities are grafted on the treated surface of the layer (LT-2).

Also, the Applicant thinks, without this limiting the scope of the invention, that by a radio-frequency glow discharge process in the presence of nitrogen atmosphere nitrogen-based functionalities are grafted on the treated surface of the layer (LT-2).

Under step (2-d) of the process of the invention, the layer (LT-2) as provided in either step (2-a) or step (2-c) is typically contacted with the composition (L3) by electroless plating techniques.

The composition (L3) typically comprises at least one compound ($M_{ot}$), at least one solvent (S) and at least one reducing agent [agent (R)].

The compound ($M_{ot}$) is typically a metal oxide selected from the group consisting of:
impurity-doped ZnO, $In_2O_3$, $SnO_2$ and CdO such as Sn-doped ZnO, $In_2O_3$ (ITO), $SnO_2$ and CdO,
ternary metal oxide compounds such as $Zn_2SnO_4$, $ZnSnO_3$, $Zn_2In_2O_5$, $Zn_3In_2O_6$, $In_2SnO_4$, $CdSnO_3$, and
multi-component metal oxides consisting of combinations of ZnO, $In_2O_3$ and $SnO_2$.

The composition (L3) preferably comprises at least one compound ($M_{ot}$) selected from the group consisting of impurity-doped ZnO, $In_2O_3$, $SnO_2$ and CdO such as Sn-doped ZnO, $In_2O_3$ (ITO), $SnO_2$ and CdO.

The agent (R) is typically selected from the group consisting of formaldehyde, hydrazine and sodium hypophosphite.

Should the layer (LT-2) as provided in either step (2-a) or step (2-c) be contacted with the composition (L3) by electroless plating techniques, the layer (LT-2) is preliminarily contacted with an electroless metallization catalyst thereby providing a catalytic layer [layer (LT-$2_c$)]. The layer (LT-$2_c$) is then contacted with the composition (L3).

The electroless metallization catalyst is typically selected from the group consisting of catalysts derived from palladium, platinum, rhodium, iridium, nickel, copper, silver and gold.

The electroless metallization catalyst is preferably selected from catalysts derived from palladium such as $PdCl_2$.

The Applicant has found that the so treated surface of the layer (LT-2) provides outstanding interlayer adhesion with a layer (LMT) applied thereto by electroless plating techniques.

Under step (2-e) of the process of the invention, the non-patterned substrate of the multilayer assembly thereby provided is typically dried at a temperature comprised between 50° C. and 150° C., preferably at a temperature comprised between 100° C. and 150° C.

Under step (3) of the process of the invention, the layer (LMP) of at least one patterned substrate is typically applied onto the layer (LMT) of at least one non-patterned substrate.

Under step (3) of the process of the invention, at least one patterned substrate is applied onto at least one surface of at least one non-patterned substrate generally using techniques commonly known in the art.

The choice of one or other of these techniques is typically made on the basis of the material and of the thickness of said patterned substrate and said non-patterned substrate.

Under step (3) of the process of the invention, at least one patterned substrate is applied onto at least one surface of at least one non-patterned substrate typically by assembling said at least one patterned substrate and said at least one non-patterned substrate onto each other.

Should the disclosure of any patents, patent applications, and publications which are incorporated herein by reference conflict with the description of the present application to the extent that it may render a term unclear, the present description shall take precedence.

The invention will be now described in more detail with reference to the following examples whose purpose is merely illustrative and not limitative of the scope of the invention.

Raw Materials

Polyethylene terephthalate (PET) commercially available from Sigma Aldrich.

Sn-doped $In_2O_3$ (ITO) commercially available from Sigma Aldrich.

Composition comprising Ag [composition (Ag)] commercially available as SunTronic® Jettable Silver Ink U5603 from Sun Chemical, Inc.

EXAMPLE 1

Manufacture of a Multilayer Assembly

A non-patterned substrate having a thickness of 125 µm was provided, said substrate having a layer made of polyethylene terephthalate (PET) directly adhered onto an optically transparent continuous layer made of Sn-doped $In_2O_3$ (ITO).

A multilayer assembly was manufactured by printing by ink-jet printing techniques, using a Dimatix DMP-2831 ink-jet printer, having a ten-pL print-head and a solvent-resistant cartridge containing the composition (Ag) filtered through a 220 nm syringe filter, a patterned grid layer having a thickness of 1.2 µm onto the optically transparent continuous layer made of ITO of said non-patterned substrate.

The patterned grid layer made of Ag thereby provided had a mesh size of 400 µm and a bar width of 20 µm.

COMPARATIVE EXAMPLE 1

Manufacture of a Patterned Substrate

A patterned grid substrate having a thickness of 125 µm was manufactured by printing by ink-jet printing techniques, onto one surface of a PET layer having a thickness of 120 µm, a patterned grid layer using the composition (Ag).

The patterned grid layer made of Ag thereby provided had a mesh size of 400 µm and a bar width of 20 µm.

COMPARATIVE EXAMPLE 2

Manufacture of a Non-patterned Substrate

A non-patterned substrate commercially available from Sigma Aldrich was used, said substrate having a thickness of 125 µm, wherein an optically transparent continuous layer made of Sn-doped $In_2O_3$ (ITO) was directly adhered onto a PET layer having a thickness of 120 µm.

Determination of the Mesh and Bar Width Structures

The mesh and bar width structures of the patterned grid layers were determined by using the Dimatix DMP-2831 ink-jet printer fiducial camera and its digital software.

Determination of the Optical Transparency

The optical transparency of the assemblies was determined by measuring transmittance values using a double beam spectrophotometer (Perkin Elmer Lambda 2). Wavelength measurement range was 200-1000 nm and data point spacing was 1 nm.

Determination of the Electrical Resistivity

The electrical resistivity of the assemblies was determined by using the four point technique (Multi Height Probe, Bridge Technology) on 25 cm$^2$ samples at room temperature in standard environment.

The results are set forth in Table 1 here below:

TABLE 1

| Run | Transmittance at 500 nm [%] | Electrical resistivity [Ω/square] |
|---|---|---|
| Ex. 1 | 60 | 12 |
| C. Ex. 1 | 65 | 85 |
| C. Ex. 2 | 78 | 60 |

It has been thus found that the multilayer assembly of the present invention advantageously provided for lower electrical resistivity values as compared with prior art assemblies while advantageously maintaining high transmittance values.

The invention claimed is:

1. A process for the manufacture of a multilayer assembly, said process comprising:
applying a patterned layer (LMP) of at least one patterned substrate directly onto a non-patterned layer (LMT) of at least one non-patterned substrate, thereby providing a multilayer assembly, wherein:
(1) the at least one patterned substrate is obtained by a process comprising:
printing a liquid composition (L1) comprising at least one first metal compound (M1) onto at least one surface of an optically transparent substrate layer (LT-1) having an outer surface and an inner surface to form a patterned layer (LMP), thus providing a patterned substrate,
optionally, contacting the patterned layer (LMP) with a liquid composition (L2) comprising at least one second metal compound (M2), said compound (M2) being equal to or different from the compound (M1), and
drying the patterned substrate, optionally contacted with composition (L2), at a temperature of at least 50° C.; and wherein
(2) the at least one non-patterned substrate is obtained by a process comprising:
optionally, treating by a radio-frequency glow discharge process in the presence of an etching gas, at least one surface of an optically transparent substrate layer (LT-2) having an outer surface and an inner surface, said layer (LT-2) being equal to or different from layer (LT-1),
contacting optionally treated layer (LT-2) with a liquid composition (L3) comprising at least one optically transparent metal compound ($M_{ot}$), to form an optically transparent non-patterned layer (LMT), thus providing a non-patterned substrate, and
drying the non-patterned substrate at a temperature of at least 50° C.

2. The process according to claim 1, wherein compound ($M_{ot}$) is a metal oxide selected from the group consisting of:
impurity-doped ZnO, $In_2O_3$, $SnO_2$ and CdO,
ternary metal oxide compounds, and
multi-component metal oxides consisting of combinations of ZnO, $In_2O_3$ and $SnO_2$.

3. The process according to claim 2, wherein compound ($M_{ot}$) is a metal oxide selected from the group consisting of Sn-doped ZnO, Sn-doped $In_2O_3$, Sn-doped CdO, $Zn_2SnO_4$, $ZnSnO_3$, $Zn_2In_2O_5$, $Zn_3In_2O_6$, $In_2SnO_4$, and $CdSnO_3$.

4. The process according to claim 1, wherein layer (LT-2) is contacted with composition (L3) by electroless plating techniques.

5. The process according to claim 1, wherein compound (M1) is selected from the group consisting of Rh, Ir, Ru, Ti, Re, Os, Cd, Tl, Pb, Bi, In, Sb, Al, Ti, Cu, Ni, Pd, V, Fe, Cr, Mn, Co, Zn, Mo, W, Ag, Au, Pt, Ir, Ru, Pd, Sn, Ge, Ga, alloys thereof and derivatives thereof.

6. The process according to claim 1, wherein composition (L1) is printed by screen, gravure, flexo or ink-jet printing techniques.

7. The process according to claim 1, wherein compound (M2) is selected from the group consisting of Rh, Ir, Ru, Ti, Re, Os, Cd, Tl, Pb, Bi, In, Sb, Al, Ti, Cu, Ni, Pd, V, Fe, Cr, Mn, Co, Zn, Mo, W, Ag, Au, Pt, Ir, Ru, Pd, Sn, Ge, Ga, alloys thereof and derivatives thereof.

8. The process according to claim 1, wherein layer (LMP) is contacted with composition (L2) by electroplating or electroless plating techniques.

9. A process for the manufacture of a multilayer assembly, said process comprising:
printing a liquid composition (L1) comprising at least one first metal compound (M1) onto an optically transparent substrate layer (LT-1) having an outer surface and an inner surface,
wherein layer (LT-1) is a non-patterned substrate comprising:
an optically transparent substrate layer (LT-2) having an outer surface and an inner surface, and
an optically transparent non-patterned layer (LMT) made of at least one optically transparent metal compound ($M_{ot}$) directly adhered onto at least one surface of layer (LT-2), and wherein said at least one surface of layer (LT-2) is optionally treated by a radio-frequency glow discharge process in the presence of an etching gas, wherein the liquid composition (L1) is printed directly on the surface of layer (LMT) that is opposite to layer (LT-2), to form a patterned layer (LMP), optionally, contacting patterned layer (LMP) with a liquid composition (L2) comprising at least one second metal compound (M2), said compound (M2) being equal to or different from the compound (M1), and drying the patterned substrate, optionally contacted with composition (L2), at a temperature of at least 50° C.

10. The process according to claim 9, wherein the non-patterned substrate is obtained by a process comprising:

optionally, treating by a radio-frequency glow discharge process in the presence of an etching gas, at least one surface of an optically transparent substrate layer (LT-2) having an outer surface and an inner surface, contacting optionally treated layer (LT-2) with a liquid composition (L3) comprising at least one optically transparent metal compound ($M_{ot}$), to form an optically transparent non-patterned layer (LMT), thus providing a non-patterned substrate, and drying the non-patterned substrate at a temperature of at least 50° C.

\* \* \* \* \*